(12) United States Patent
Neag et al.

(10) Patent No.: US 12,181,498 B2
(45) Date of Patent: Dec. 31, 2024

(54) CURRENT SENSE CIRCUIT INCLUDING A CONTROLLABLE CURRENT MIRROR AND A BIASING CIRCUIT

(71) Applicant: Infineon Technologies AG, Neubiberg (DE)

(72) Inventors: Marius-Georghe Neag, Cluj-Napoca (RO); Istvan Kovacs, Cluj-Napoca (RO); Paul-Nutu Miresan, Cluj-Napoca (RO)

(73) Assignee: Infineon Technologies AG, Neubiberg (DE)

( * ) Notice: Subject to any disclaimer, the term of this patent is extended or adjusted under 35 U.S.C. 154(b) by 157 days.

(21) Appl. No.: 18/060,483

(22) Filed: Nov. 30, 2022

(65) Prior Publication Data

US 2023/0184813 A1 Jun. 15, 2023

(30) Foreign Application Priority Data

Dec. 10, 2021 (DE) .......................... 102021132633.8

(51) Int. Cl.
*G01R 19/00* (2006.01)
*H03F 3/45* (2006.01)

(52) U.S. Cl.
CPC ....... *G01R 19/0092* (2013.01); *H03F 3/4547* (2013.01); *H03F 3/45937* (2013.01)

(58) Field of Classification Search
CPC ................ G01R 15/08; G01R 19/0023; G01R 19/0092; H03F 3/4547; H03F 3/45937;

(Continued)

(56) References Cited

U.S. PATENT DOCUMENTS 9,217,777 B2 * 12/2015 Knill .................... G01R 31/382
2006/0267687 A1 * 11/2006 Gammie .................. H03F 1/34
330/260

(Continued)

FOREIGN PATENT DOCUMENTS

DE     60309155 T2   8/2007
EP      1503490 A1   2/2005

OTHER PUBLICATIONS

Yang et al., "Design of High-side Current Sense Amplifier with Ultra-wide ICMR", 2009 52nd IEEE International Midwest Symposium on Circuits and Systems, IEEE, Aug. 2, 2009, pp. 5-8.

(Continued)

*Primary Examiner* — Jay Patidar
(74) *Attorney, Agent, or Firm* — Shumaker & Sieffert, P.A.

(57) ABSTRACT

A current sense circuit may comprise a first circuit node and a second circuit node configured to be coupled to a first terminal and a second terminal of a current sense resistor, respectively; differential amplifier including a first input and a second input which are coupled to the first circuit node and the second circuit node via a first input resistor and a second input resistor; a voltage source, configured to set the voltage at the first input of the differential amplifier; and a controllable current mirror configured to sink or source a first current in its input branch based on one or more outputs of the differential amplifier and to generate a corresponding second current in its output branch. The input branch is coupled to the second input of the differential amplifier. A biasing circuit is coupled to the controllable current mirror.

11 Claims, 4 Drawing Sheets

(58) Field of Classification Search
CPC . H03F 2203/45081; H03F 2203/45581; H03F 3/45475
See application file for complete search history.

(56) References Cited

U.S. PATENT DOCUMENTS

2017/0238093 A1* 8/2017 Heil .................. H03F 3/183
                                                    381/55
2020/0328719 A1* 10/2020 Tsai ................... H03F 3/45475

OTHER PUBLICATIONS

Zhou et al., "Lossless bi-directional current sense circuit for low-voltage high-current DC/DC converters", IECON 2018—44th Annual Conference of the IEEE Industrial Electronics Society, IEEE, Oct. 21, 2018, pp. 1305-1308.

* cited by examiner

CURRENT SENSE CIRCUIT INCLUDING A CONTROLLABLE CURRENT MIRROR AND A BIASING CIRCUIT This Application claims priority to German Application Number 102021132633.8, filed on Dec. 10, 2021, the entire content of which is incorporated herein by reference.

TECHNICAL FIELD

The present disclosure relates to the field of current sensing. In particular to a current sense circuit which is capable of measuring a current passing through a sense resistor.

BACKGROUND

Many concepts for measuring currents are known. Many approaches make use of a current sense resistor and an amplifier circuit that is configured to amplify the voltage drop across the current sense resistor. The output signal of the amplifier circuit represents the current passing through the current sense resistor.

Usually, the current sense resistor is coupled between a voltage source and a load. Many known approaches used for measuring the current passing through the current sense resistor are only suitable for unidirectional measurement. That is, the circuit is only able to measure current in one direction, e.g. current running from the source to the load but not from the load to the source which may be the case for some types of loads. The mentioned amplifier circuit is basically a difference amplifier configured to measure the difference of the voltages present at the input terminals of the current sense circuit. A resulting problem is that some properties of the difference amplifier depend on the (common mode) voltage at the amplifier input. For example, the offset voltage of an operational amplifier generally varies with the common-monde voltage at the amplifier inputs. This dependency leads to an error that cannot be compensated by one-time calibration. To reduce this effect, operational amplifiers with a high CMMR (common-mode rejection ratio) and a very low offset voltage may be used. However, this adds complexity to the overall circuit and increases the costs.

Furthermore, in many known current sense circuits, the range of the common mode voltage levels at the sensor inputs is limited by the range of input common mode voltage levels over which the difference amplifier can operate. Moreover, a bidirectional current sensing with a smooth crossing over the zero level is a problem for many known current sense circuits.

The inventors identified a need to improve current sense circuits in order to at least alleviate the problems sketched above.

SUMMARY

The mentioned objective is achieved by the circuit of claim 1. Various embodiments and further developments are covered by the dependent claims.

A current sense circuit is described herein. In accordance with one embodiment, the circuit comprises: a first circuit node and a second circuit node configured to be coupled to a first terminal and a second terminal of a current sense resistor, respectively; a differential amplifier having a first input and a second input which are coupled to the first circuit node and the second circuit node via a first input resistor and a second input resistor; a voltage source, configured to set the voltage at the first input of the differential amplifier to a predefined DC voltage; and a controllable current mirror configured to sink or source a first current in its input branch based on one or more outputs of the differential amplifier and to generate a corresponding second current in its output branch. The input branch is coupled to the second input of the differential amplifier. A biasing circuit is configured to generate a bias current and is coupled to the controllable current mirror to superpose the bias current with either the first current or the second current.

A corresponding method is also described. In accordance with one embodiment, the method includes receiving a sense voltage between a first circuit node and a second circuit node coupled to a first terminal and a second terminal of a current sense resistor, respectively, wherein a first input and a second input of a differential amplifier are coupled to the first circuit node and the second circuit node via a first input resistor and a second input resistor, respectively. The method further includes setting the voltage at the first input of the differential amplifier to a predefined DC voltage and sinking/sourcing a first current in/from an input branch of a controllable current mirror based on one or more outputs of the differential amplifier and generating, by the controllable current mirror, a corresponding second current in its output branch. The input branch is coupled to the second input of the differential amplifier. Moreover, the method includes generating a bias current and superposing the bias current with either the first current or the second current.

BRIEF DESCRIPTION OF THE DRAWINGS

The embodiments described below can be better understood with reference to the following drawings and descriptions. The components in the figures are not necessarily to scale; instead, emphasis is placed upon illustrating the principles underlying the embodiments. Moreover, in the figures, like reference numerals designate corresponding parts. In the drawings:

FIG. 5 also shown one exemplary implementation of the controllable current mirror of FIG. 2.

DETAILED DESCRIPTION

Figure 1:
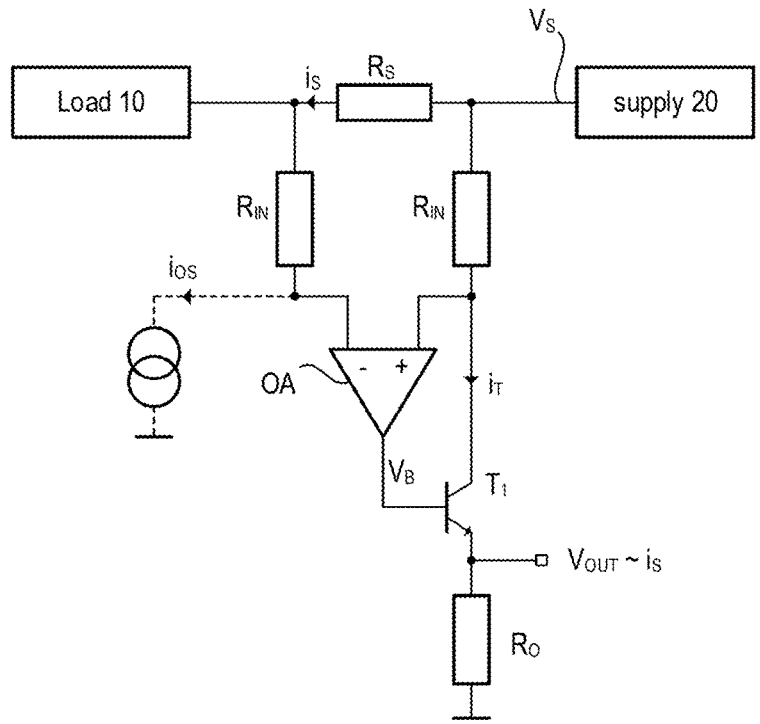
FIG. 1 illustrates one example of a known current sense circuit.

FIG. 1 illustrates one example of a known current sense circuit which is used in different commercially available products (e.g. Texas Instruments INA170 High-Side, Bidirectional Current Shunt Monitor). As shown in FIG. 1, a current sense resistor $R_S$ (also referred to as shunt resistor) is connected between a supply 20 and a load 10. The amplifier circuit includes an operational amplifier OA whose inverting and non-inverting inputs are connected to the two ends of the current sense resistor $R_S$ via two identical input resistors $R_{IN}$. The output of the operational amplifier OA is connected to the base of a bipolar transistor $T_1$ whose collector is connected to the non-inverting input of the operational amplifier OA. The emitter of the transistor $T_1$ is connected to a ground node via an output resistor $R_O$. The output voltage $V_{OUT}$ is the voltage across the resistor $R_O$ which is proportional to the voltage drop $R_S \cdot i_S$ across the current sense resistor $R_S$ and thus also proportional to the current $i_S$ passing through the current sense resistor $R_S$. To allow a bidirectional current measurement, a current sink, which generates an offset current $i_{OS}$, is connected to inverting input of the operational amplifier.

It can be easily shown that the output voltage $V_{OUT}$ of the circuit of FIG. 1 is given by $V_{OUT} = R_S \cdot i_S \cdot (R_O/R_{IN}) + I_{OS} \cdot R_O$. The offset voltage $I_{OS} \cdot R_O$ allows the current $i_S$ to become negative while the output voltage $V_{OUT}$ of the amplifier circuit remains positive. This calculation neglects the base current of the transistor $T_1$, which would increase the actual offset voltage. The bidirectional operating range is set by the offset current $i_{OS}$. For calibration purposes the current source may be adjustable.

As can be seen in FIG. 1, the common mode voltage at the inputs of the operational amplifier OA depends on the supply voltage $V_S$ provided by power supply 20. As a result, the circuit of FIG. 1 can only operate in a situation, in which the supply voltage $V_S$ does not exceed the maximum input common-mode voltage of the operational amplifier OA by more than the voltage across the input resistors RIN. In case the supply voltage $V_S$ is also used as supply voltage for the operational amplifier OA, it is limited to the specified maximum supply voltage of the operational amplifier. Furthermore, a potentially varying common mode voltage at the inputs of the operational amplifier OA may lead to a varying offset voltage of the operational amplifier OA, which cannot be compensated for by one-time calibration. The finite CMRR and the finite (non-zero) input currents of the operational amplifier OA have similar effects.

Figure 2:
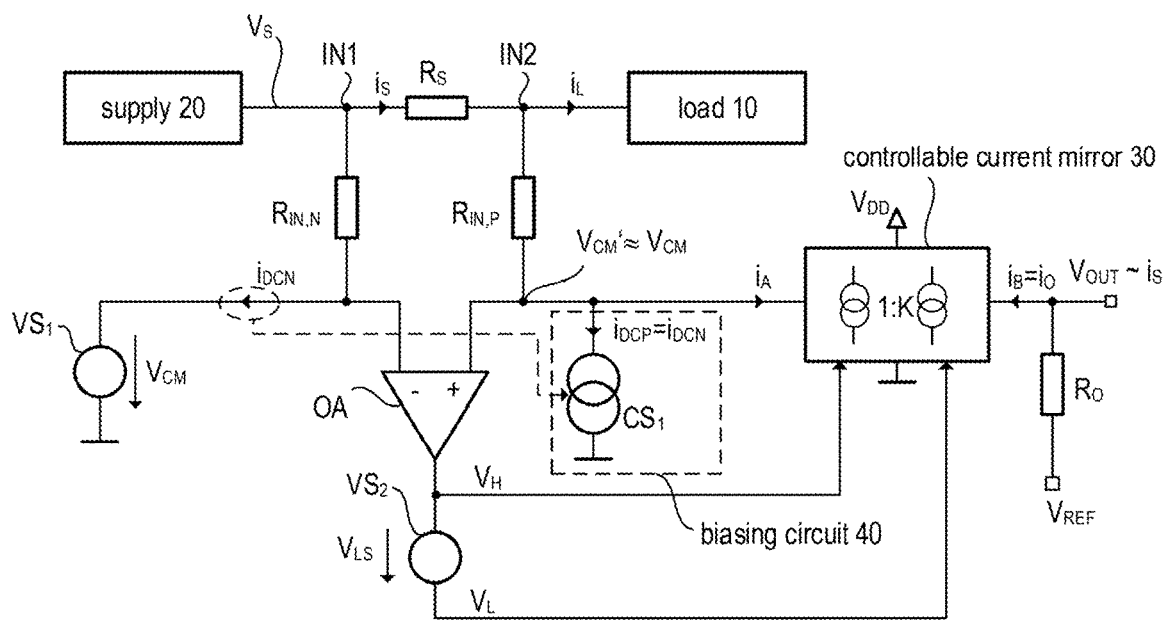
FIG. 2 illustrates an example of a current sense circuit in accordance with one embodiment.

FIG. 2 illustrates one exemplary embodiment of a current sense circuit which does not have the limitations mentioned above with regard to FIG. 1. Similar to the previous example, a current sense resistor $R_S$ is connected between a power supply 20 and a load 10. The circuit nodes, between which the current sense resistor $R_S$ is connected are denoted IN1 and IN2. An amplifier circuit is coupled to the current sense resistor $R_S$. The amplifier circuit includes a differential amplifier (e.g. an operational amplifier OA) with a first input (inverting input labelled "−") and a second input (non-inverting input labelled "+") that are coupled to the first circuit node IN1 and the second circuit node IN2 via a first input resistor $R_{IN,N}$ and a second input resistor $R_{IN,P}$, respectively. In the embodiments described herein, the resistance values of the resistors $R_{IN,N}$ and $R_{IN,P}$ may be equal ($R_{IN,N} = R_{IN,P} = R_{IN}$).

Different from the previous example, a voltage source $VS_1$ is coupled to the non-inverting input of the operational amplifier OA and configured to set the voltage at the inverting input to a predefined DC voltage $V_{CM}$. As a result, a current $i_{DCN}$ will flow through the resistor $R_{IN,N}$ to the voltage source $VS_1$ during operation of the circuit. The purpose of the voltage source $VS_1$ is to set the common-mode voltage at the inputs of the operational amplifier OA to a defined constant voltage value $V_{CM}$ that does not change with a varying supply voltage $V_S$. As a result, the above-mentioned problems which arise from an a-priori unknown and potentially varying common-mode voltage are avoided in the circuit of FIG. 2.

To compensate for the effect of the current $i_{DCN}$, a current source $CS_1$ is coupled to the non-inverting input of the operational amplifier OA in the example of FIG. 2. The current $i_{DCP}$ generated by current source $CS_1$ contributes to the total current passing through resistor $R_{IN,P}$. Accordingly, the total current passing through the resistor $R_{IN,P}$ is $i_A + i_{DCP}$. In the present embodiment, the current source $CS_1$ is designed such that the current $i_{DCP}$ may be equal to the current $i_{DCN}$ flowing through resistor $R_{IN,N}$ to the voltage source $VS_1$ (i.e. $i_{DCP} = i_{DCN} = i_{DC}$). This equality of the currents $i_{DCP}$ and $i_{DCN}$ may be achieved, for example, by current mirrors.

The current $i_A$ is amplified by a controllable current mirror 30 having a mirror ratio of 1:K. That is, the output current $i_B$ of the current mirror 30 equals $K \cdot i_A$. The current mirror 30 is configured to sink/source a first current (which is current $i_A$) to/from its input branch based on one or more outputs of the differential amplifier OA and to generate a corresponding second current (output current $i_B$) in its output branch. In the present example, the operational amplifier OA sets the operating point of the current mirror 30 such that the current in the input branch of the current mirror equals the residual current $i_A$ (total current passing through resistor $R_{IN,P}$ minus current $i_{DCP}$ generated by current source $CS_1$). In the implementation the operational amplifier provides, at its output, a voltage $V_H$ which is level-shifted by voltage $V_{LS}$ (see FIG. 2, voltage source $VS_2$) to obtain the voltage $V_L$. The voltage $V_L$ sets the operating point of the current mirror 30 for a positive current $i_A$ (i.e. current mirror 30 sinks current $i_A$), whereas the voltage $V_L$ sets the operating point of the current mirror 30 for a negative current $i_A$ (current mirror 30 sources current $i_A$).

It is understood, that the voltage source $VS_2$ which is used to provide the level-shifted voltage $V_L$ may also be considered as part of the output stage of the operational amplifier OA or, alternatively, as part of the controllable current mirror 30. The important aspect is merely, that the controllable current mirror 30 is part of a feedback network used for operating the operational amplifier OA (current mirror 30 couples the output of the operational amplifier back to the non-inverting input). In a stable state of operation, the voltages at the two inputs of the operational amplifier OA are essentially equal (i.e. $V_{CM} \approx V_{CM}'$). It can be easily shown that, when $R_{IN,P} \cdot i_{DCP} = R_{IN,N} \cdot i_{DCN}$ holds true, the current $i_A$ is proportional to the current $i_S$ in the example of FIG. 2, i.e. $i_A = R_S \cdot i_S / R_{IN,P}$. Consequently, $i_B = K \cdot R_S \cdot i_S / R_{IN,P}$.

To obtain an output voltage indicative of the voltage drop $R_S \cdot i_S$ across the current sense resistor $R_S$, the output current $i_B$ of the controllable current mirror needs to be converted into a corresponding voltage. The easiest way to accomplish this is to direct the current $i_B$ through an output resistor $R_O$ which is connected between the current mirror output and a circuit node providing a reference voltage $V_{REF}$. The difference $V_{OUT} - V_{REF}$ is indicative of the current $i_S$. It is noted that the difference $V_{OUT} - V_{REF}$ may become negative (for negative currents $i_S$) while the output voltage $V_{OUT}$ remains positive.

It is noted that, as the common-mode voltage at the inputs of the operational amplifier is fixed, the supply voltage $V_S$ provided by the power supply 20 can be (significantly) higher than the supply voltage $V_{DD}$ used to supply the current mirror 30 and the operational amplifier OA. Further, the supply voltage $V_S$ can be lower than the supply voltage $V_{DD}$ ($V_S$ can even be negative). Furthermore, any offset included in the output voltage $V_{OUT}$ may be compensated by fine-tuning the reference voltage $V_{REF}$.

Figure 3:
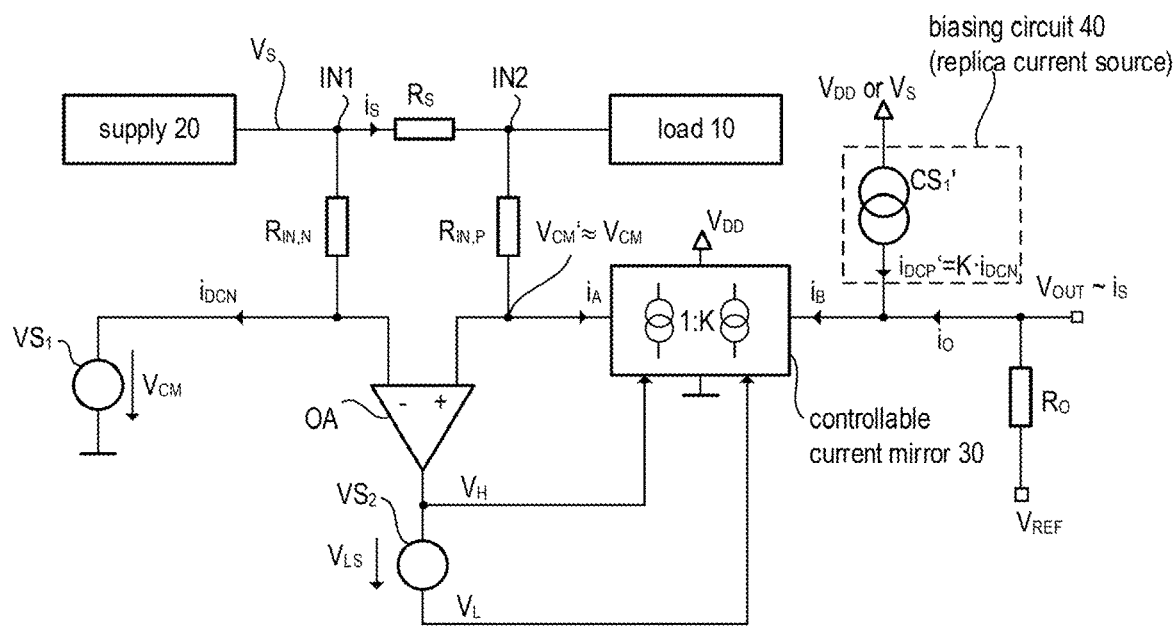
FIG. 3 illustrates an example of a current sense circuit in accordance with another embodiment.

FIG. 3 illustrates another embodiment which is very similar to the previous embodiment of FIG. 2. Accordingly, the following discussions focusses on the differences between the two examples of FIGS. 2 and 3. In the previous example of FIG. 2, the purpose of the controlled current source $CS_1$ (current $i_{DCP}$) is basically to compensate for the effect of the current $i_{DCN}$ passing through $R_{IN,N}$. As explained above, the current $i_{DCN}$ is a result of the voltage source $VS_1$ setting the common-mode voltage at the inputs of the operational amplifier OA to the desired value $V_{CM}$, and the effect of the resulting voltage drop $R_{IN,N} \cdot i_{DCN}$ on the current $i_A$ (input current of current mirror 30) is eliminated by the corresponding voltage drop $R_{IN,P} \cdot i_{DCP}$, if $R_{IN,P}=R_{IN,N}$ and $i_{DCP}=i_{DCN}$. Current source $CS_1$ is connected to the common circuit node of the non-inverting input of the operational amplifier and the current input of the current mirror 30. The same effect can be achieved by a current source $CS_1'$ connected to the current output of the current mirror 30, when the bias current $i_{DCP}'$ generated by current source $CS_1'$ equals K times $i_{DCN}$ (K being the mirror ratio of the current mirror 30). This situation is depicted in FIG. 3.

More generally, the current source $CS_1'$ may be regarded as biasing circuit or part of a biasing circuit 40. When the current source $CS_1'$ is tunable, the current $i_{DCP}'$ can be used to fine-tune the output voltage $V_{OUT}$. Adjusting $i_{DCP}'$ has a similar effect on the output voltage $V_{OUT}$ as adjusting the reference voltage $V_{REF}$. It is noted that the current source CS'/biasing circuit 40 may either be sourced from the supply 20 (supply voltage $V_S$) or from the supply circuit (not shown) providing supply voltage $V_{DD}$ (which may be lower than $V_S$). Apart from the biasing circuit 40 (current sources CS, CS') the example of FIG. 3 is identical to the example of FIG. 2 and reference is made to the respective description above.

Figure 4:
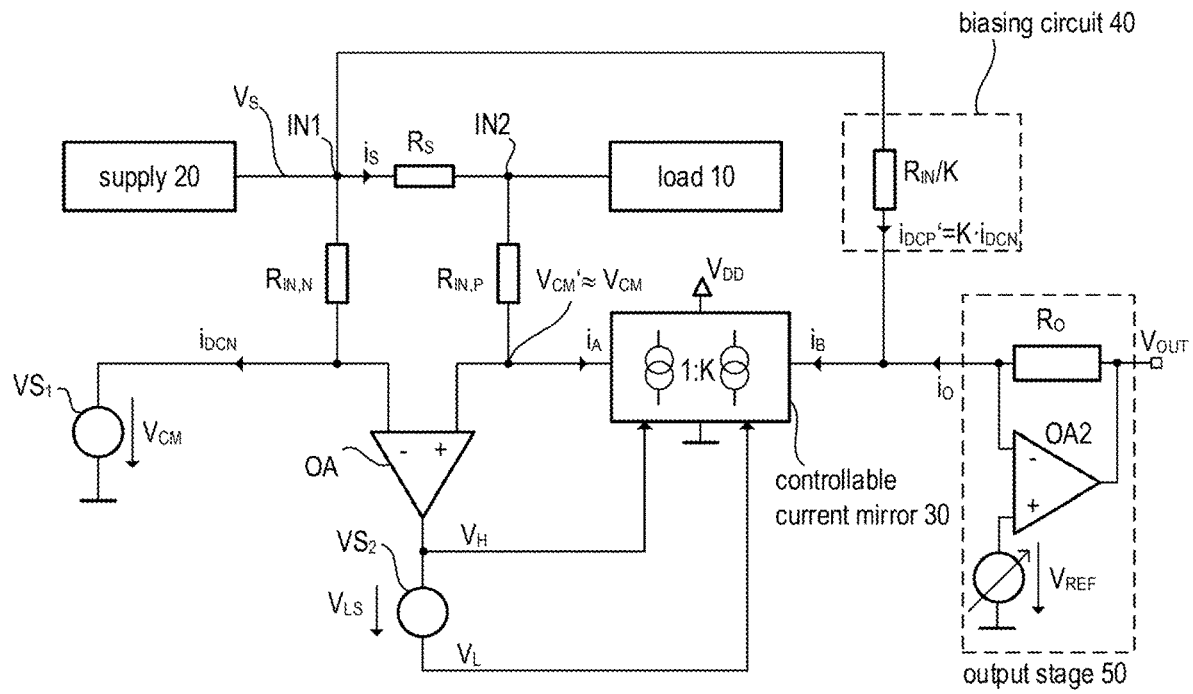
FIG. 4 illustrates another embodiment which is a modification of the circuit of FIG. 3.

FIG. 4 illustrates a further exemplary embodiment, which differs from the circuit of FIG. 3 essentially in the biasing circuit 40 and the output stage 50. When the biasing circuit 40 is connected to the output of the controllable current mirror 30, then the biasing circuit 40 may be implemented in a very easy way as shown in FIG. 4. Accordingly, the biasing circuit 40 may be a simple resistor that has a resistance of $R_{IN,P}/K$ and is connected between a circuit node providing the voltage $V_S$ and the output of the current mirror 30. In the circuit of FIG. 3 as well as in the circuit of FIG. 4, the output current $i_O$ equals $i_B - i_{DCP}' = i_B - K \cdot i_{DCN}$.

In the example of FIG. 4, the output stage 50 is more complex than in the preceding examples. Accordingly, the output stage 50 is basically a current-to-voltage converter implemented using an operational amplifier OA2 whose output is coupled to its inverting input via resistor $R_O$. A reference voltage $V_{REF}$ may be applied to the non-inverting input of the operational amplifier OA2. The reference voltage $V_{REF}$ will result in an offset in the output voltage $V_{OUT}$. It is understood that, when the bias circuit 40 is implemented by a single resistor as shown in FIG. 4, then the offset voltage $V_{REF}$ has to be essentially equal to the common mode voltage $V_{CM}$. As shown in FIG. 4 the voltage $V_{REF}$ may be fine-tuned to adjust the actual offset included in the output voltage $V_{OUT}$. Apart from the bias circuit 40 and the output stage 50, the circuit of FIG. 4 is identical to the circuit of FIG. 3 and reference is made to the respective description above.

Figure 5:
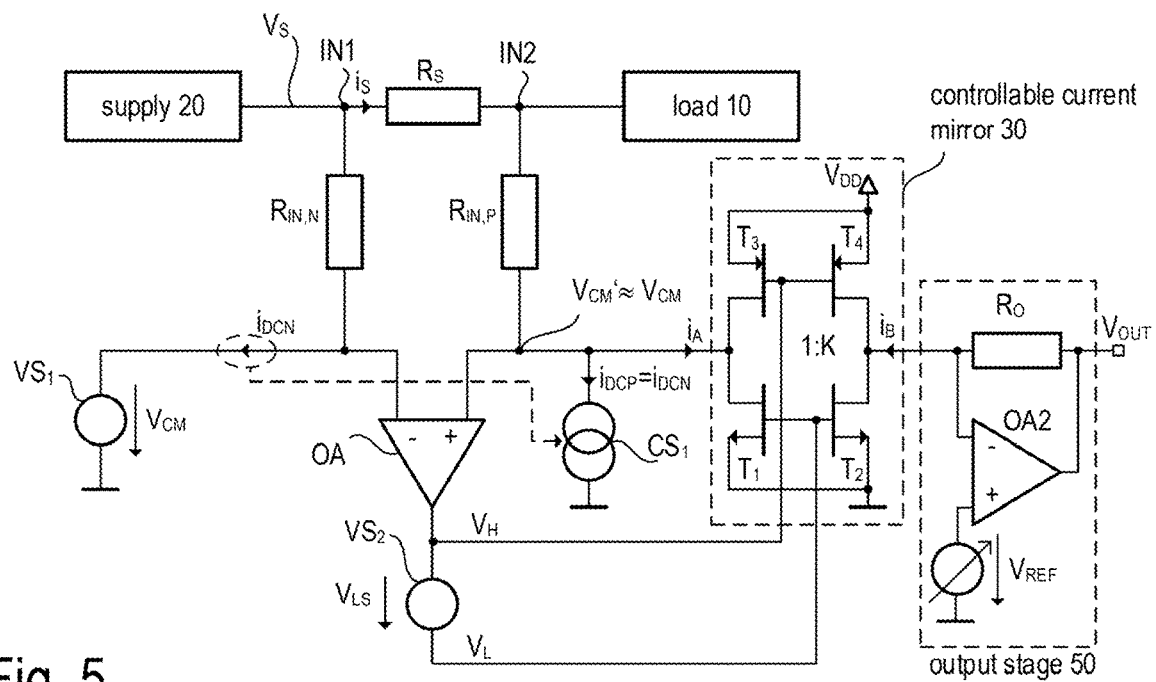
FIG. 5 illustrates another embodiment which is a modification of the circuit of FIG. 2.

FIG. 5 illustrates a further embodiment, which is a modification of the circuit of FIG. 2. In essence, the circuit of FIG. 5 is the same as the circuit of FIG. 2 except for the output stage, which is implemented in the same way as in the example of FIG. 4. In the present example, the reference voltage $V_{REF}$ which determines the offset in the output voltage may deviate from the common-mode voltage $V_{CM}$.

FIG. 5 also includes one exemplary implementation of the current mirror 30. The input branch of the current mirror 30 is composed of a series connection of two transistor $T_1$ and $T_3$, wherein series connection means that the drain-source current paths (or collector-emitter current paths in case of bipolar transistors). Similarly, the output branch of the current mirror 30 is composed of a corresponding series connection of two transistor $T_2$ and $T_4$. In the depicted example, the low-side transistors $T_1$ and $T_2$ are n-channel MOS transistors, whereas the high-side transistors $T_3$ and $T_4$ are p-channel MOS transistors. It is understood that npn-type and pnp-type bipolar transistors may be used instead. As in any current mirror, the gates (or the bases in case of bipolar transistors) of the two high-side transistors $T_3$ and $T_4$ are interconnected. Similarly, the gates of the low-side transistors $T_1$ and $T_2$ are interconnected. The active area of the transistors $T_2$ and $T_4$ in the output branch is K times the active area of the corresponding transistors in $T_1$ and $T_3$ the input branch, so that the output current $i_B$ will be K times the input current $i_A$.

The operational amplifier OA will drive/control the gates of the transistors $T_1$-$T_4$ included in the current mirror 30 such that the voltage $V_{CM}'$ at the non-inverting input of the operational amplifier OA is approximately equal to the common mode voltage $V_{CM}$ set by the voltage source $VS_1$. Accordingly, for a positive current $i_A$ the operational amplifier OA will generate voltages $V_H$ and $V_L$ (wherein $V_L = V_H - V_{LS}$) such that the voltage $V_H$ is high enough to switch the high-side transistors $T_3$ and $T_4$ off while the voltage VL assumes such a value that the equality $V_{CM}' = V_{CM}$ is (approximately) fulfilled. Similarly, for a negative current $i_A$ the operational amplifier OA will generate voltages $V_H$ and $V_L$ (wherein $V_L = V_H - V_{LS}$) such that the voltage $V_L$ is low enough to switch the low-side transistors $T_1$ and $T_2$ off while the voltage $V_H$ assumes such a value that the equality $V_{CM}' = V_{CM}$ is (approximately) fulfilled. That is, for a positive current $i_A$ only the low-side current mirror composed of transistors $T_1$ and $T_2$ is active, while for a negative current $i_A$ only the high-side current mirror composed of transistors $T_3$ and $T_4$ is active. Negative currents flow in a direction which is opposite to the direction indicated by the arrows in FIG. 5. It is understood, however, that FIG. 5 is merely an example representing a specific embodiment. In another example, the circuit may be designed such that a DC biasing current always flows through both current mirrors (high-side and low-side current mirrors).

Figure 6:
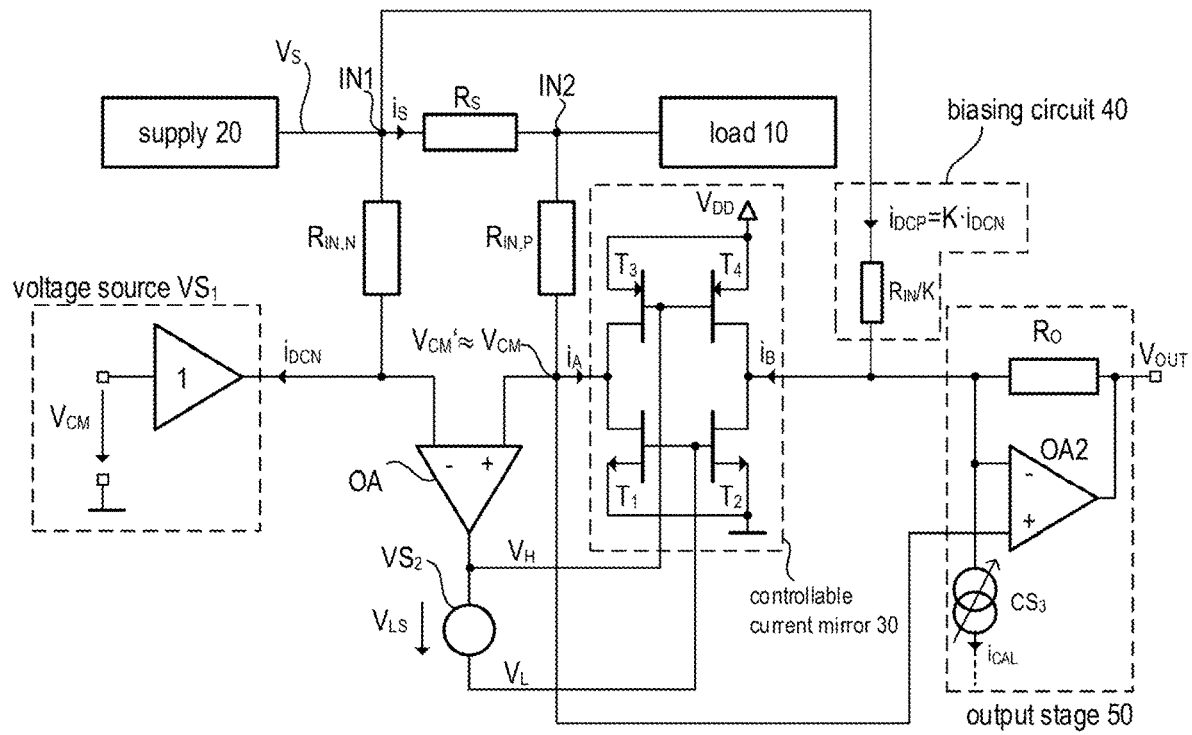
FIG. 6 illustrates another embodiment which is a modification of the circuit of FIG. 4.

To summarize the above explanations, the controllable current mirror 30 is capable to mirror positive as well as negative input currents $i_A$. For this purpose, the controllable current mirror 30 includes two transistor pairs, namely a pair of high-side transistors $T_3$ and $T_4$ which form a first current mirror that is active for negative input currents $i_A$, and a pair of low-side transistors $T_1$ and $T_2$ which form a second current mirror that is active for positive input currents $i_A$. The operational amplifier OA generates the voltages $V_H$ and $V_L$ (wherein $V_L = V_H - V_{LS}$) which drive the gates (or bases in case of bipolar transistors) of the transistor pairs $T_3$, $T_4$ and $T_1$, $T_2$, respectively, such that the voltage $V_{CM}'$ at the non-inverting input of the operational amplifier OA approximately equals the common mode voltage $V_{CM}$ set by voltage source $VS_1$. As mentioned, the voltage source $VS_2$ which is responsible for the level-shift between voltages $V_H$ and $V_L$ may be regarded as part of the output state of the operational amplifier OA (or, alternatively, as part of the control circuitry of the current mirror 30). Apart from the output stage 50 and the specific implementation of the current mirror 30, the circuit of FIG. 5 is identical to the circuit of FIG. 2 and reference is made to the respective description above The example of FIG. 6 is basically the same as the circuit of FIG. 4 but with a slightly different implementation of the output stage 50. Further, one possible implementation of the voltage source $VS_1$ is shown in FIG. 6. Accordingly, the voltage source $VS_1$ is realized using a buffer amplifier (with unity gain) with an output stage that can sink the current $i_{DCN}$. The basing circuit 40 is implemented in the same way as in the example of FIG. 4, and the controllable current source 30 is implemented in the same way as in the example of FIG. 5. In FIG. 6, the output stage 50 includes a current-to-voltage converter which is constructed similar as shown in FIG. 4. However, in the present example, the voltage $V_{CM}'$ at the non-inverting input of the operational amplifier OA is used as reference voltage of the operational amplifier OA2 in the output stage. Accordingly, the non-inverting inputs of the two operational amplifiers OA and OA2 are interconnected. The output voltage $V_{OUT}$ may be fine-tuned by tuning the current $i_{CAL}$ generated by the current source $CS_3$ that is connected to the inverting input of the operational amplifier OA2. In another embodiment, the voltage $V_{CM}$ at the inverting input of the operational amplifier OA is used as reference voltage of the operational amplifier OA2 in the output stage.

The embodiments discussed so far are all suitable for bidirectional current measurement. That is, the current sense circuits are not only capable of measuring currents flowing from the power supply 20 to the load 10 but also currents in the opposite direction. In the latter case, the current $i_S$ and thus the voltage $R_S \cdot i_S$ change polarity. In applications, in which a bidirectional current measurement is not necessary, a simpler circuit may be used as, for example shown in FIG. 7.

Figure 7:
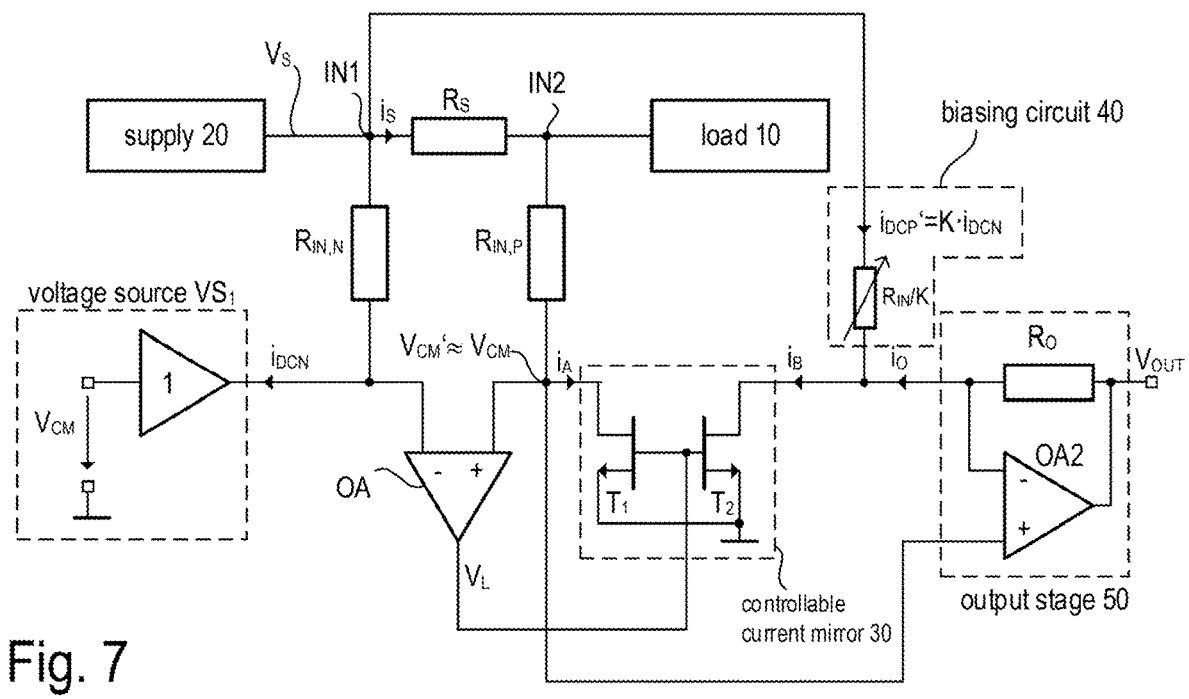
FIG. 7 illustrates another embodiment which is a simplification of the circuit of FIG. 6.

The circuit of FIG. 7 is a simplifying modification of the circuit of FIG. 6. In essence, in FIG. 7, the controllable current mirror 30 basically consists of the low-side transistor pair $T_1$ and $T_2$ which makes the generation of the two output signals $V_L$ and $V_H$, which are level-shifted with respect to each other, superfluous. Accordingly, in FIG. 7, the output voltage of the operational amplifier OA is only the voltage $V_L$, which is supplied to the gates of the transistors $T_1$ and $T_2$.

As in all examples discussed herein, the controllable current mirror 30 is in the feedback loop of the operational amplifier OA. Thus, the operational amplifier OA controls the operating point of the current mirror such that the voltage $V_{CM}'$ at the non-inverting input of the operational amplifier OA substantially equals to the common mode voltage $V_{CM}$ provided by the voltage source $VS_1$. It is understood that there will be a small offset between the voltages $V_{CM}$ and $V_{CM}'$ due to the intrinsic properties of the operational amplifier OA. For the example of FIG. 7, it can be shown that $i_B = K \cdot i_A = K \cdot i_S \cdot R_S / R_{IN} + K \cdot i_{DCN}$ (with $R_{IN,P} = R_{IN,N} = R_{IN}$) and $i_B = i_O + K \cdot i_{DCN}$. Combining the two equations leads to the following expression for the output current $i_O$: $i_O = K \cdot i_S \cdot R_S / R_{IN}$. The output current $i_O$ can be converted into a corresponding output voltage $V_{OUT}$ by the output stage 50. It is understood, that a corresponding unidirectional current sense circuit may be built for negative currents. In this case, the controllable current mirror may only include the high-side transistor pair $T_3$ and $T_4$.

Some important aspects/features of the embodiments are summarized below. It is understood that the following is not an exhaustive enumeration of features but rather an exemplary summary. In accordance with the embodiments described herein a current sense circuit includes a first circuit node and a second circuit node configured to be coupled to a first terminal and a second terminal of a current sense resistor, respectively (see FIGS. 2-7, resistor $R_S$ and circuit nodes IN1 and IN2). The circuit further includes a differential amplifier having a first input (inverting) and a second input (non-inverting) which are coupled to the first circuit node and the second circuit node via a first input resistor and a second input resistor (see FIGS. 2-7, nodes IN1 and IN2 are connected to the inputs of operational amplifier OA via resistors $R_{IN,N}$ and $R_{IN,P}$). The circuit further includes a voltage source that is configured to set the voltage at the first input of the differential amplifier (e.g. operational amplifier OA) to a predefined DC voltage, referred to as common mode voltage $V_{CM}$ (cf. FIGS. 2-7). A controllable current mirror is configured to sink or source a first current in/from its input branch based on one or more outputs of the differential amplifier and to generate a corresponding second current in its output branch (see FIGS. 2-7, input current $i_A$ and output current $i_B$ of current mirror 30, which is controlled by voltages $V_L$ and/or $V_H$). Thereby, the input branch of the current mirror is coupled to the second input of the differential amplifier. Finally, the current sense circuit includes a biasing circuit configured to generate a bias current and coupled to the controllable current mirror to superpose the bias current with either the first current or the second current (see FIGS. 2-7, the biasing circuit 40 is either connected to the input or to the output of the current mirror 40).

In one embodiment, the biasing circuit is configured to generate a bias current that compensates for the effect of a current passing through the voltage source. As discussed above, in implementations, in which the biasing circuit is coupled to the output of the current mirror, the bias current needs to be K times greater than in implementations, in which the biasing circuit is coupled to the input of the current mirror, wherein K is the mirror ratio of the current mirror. In practically all embodiments, the biasing circuit 40 may be configured to allow fine-tuning/calibration of the output voltage of the current sense circuit. This aspect is particularly useful, in the examples of FIGS. 4, 6, and 7, in which the biasing circuit is basically formed by the resistor with resistance $R_{IN}/K$.

In some embodiments, the biasing circuit is coupled to input branch of the controllable current mirror, and the bias current is equal to the current passing through the voltage source. In some other embodiments, the biasing circuit is coupled to the output branch of the controllable current mirror, and the bias current is equal to the current passing through the voltage source times a transfer ratio (mirror ratio) of the controllable current mirror.

The voltage source may, in some embodiments, include a buffer amplifier configured to output the desired common mode voltage $V_{CM}$ in accordance with an input voltage applied to the buffer amplifier (see, e.g. FIG. 6).

An output stage may be coupled to the output branch of the controllable current mirror. The output stage may be configured to provide an output signal (e.g. voltage $V_{OUT}$ or current $i_O$) indicative of the current passing through the current sense resistor $R_S$. In some embodiments, the purpose of the output stage is to set the voltage at the output of current mirror to a desired voltage value (e.g. to the voltage $V_{CM}$ or $V_{CM}'$, cf. FIG. 6 or 7, or to a reference voltage $V_{REF}$) In some embodiments, the output stage may be configured to generate the output voltage based on the output current of the current mirror and an adjustable offset current or voltage (see FIGS. 5 and 6, adjustable voltage $V_{REF}$, adjustable current $i_{CAL}$).

In the embodiments described herein, the calibration/fine-tuning of the output signal can reasonably be accomplished in a one-time calibration, e.g. in an end-of-line test or a specific product. This is possible, as the offset-voltage of the operational amplifier OA does not vary as the common-mode voltage is basically fixed to $V_{CM}$. Finally, it is noted that the aspects/features described herein with reference to different embodiments may be combined to obtain further embodiments.

Although the invention has been illustrated and described with respect to one or more implementations, alterations and/or modifications may be made to the illustrated examples without departing from the spirit and scope of the appended claims. For example, in various examples described herein, the current mirror could be designed to invert the signal. As a consequence, the inverting and the non-inverting input nodes of the operational amplifier need to be interchanged. In particular regard to the various functions performed by the above described components or structures (units, assemblies, devices, circuits, systems, etc.), the terms (including a reference to a "means") used to describe such components are intended to correspond— unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. A current sense circuit comprising:
a first circuit node and a second circuit node configured to be coupled to a first terminal and a second terminal of a current sense resistor, respectively;
an differential amplifier including a first input and a second input which are coupled to the first circuit node and the second circuit node via a first input resistor and a second input resistor;
a voltage source configured to set a voltage at the first input of the differential amplifier to a predefined direct current (DC) voltage;
a controllable current mirror configured to sink or source a first current in its input branch based on one or more outputs of the differential amplifier and to generate a corresponding second current in its output branch, the input branch being coupled to the second input of the differential amplifier; and
a biasing circuit configured to generate a bias current and coupled to the controllable current mirror to superpose the bias current with either the first current or the second current.

2. The current sense circuit of claim 1,
wherein the biasing circuit is configured to generate a bias current that compensates for an effect of a third current passing through the voltage source.

3. The current sense circuit of claim 2,
wherein the biasing circuit is coupled to input branch of the controllable current mirror and the bias current is equal to the third current passing through the voltage source.

4. The current sense circuit of claim 2,
wherein the biasing circuit is coupled to the output branch of the controllable current mirror and the bias current is equal to the third current passing through the voltage source multiplied by a transfer ratio of the controllable current mirror.

5. The current sense circuit of claim 1,
wherein the voltage source includes a buffer amplifier configured to output the predefined DC voltage in accordance with an input voltage applied to the buffer amplifier.

6. The current sense circuit of claim 1, further comprising:
an output stage coupled to the output branch of the controllable current mirror and configured to provide an output signal indicative of a fourth current passing through the current sense resistor.

7. The current sense circuit of claim 6,
wherein the output stage is configured to set an output voltage at the output of the current mirror to a desired reference voltage.

8. The current sense circuit of claim 7,
wherein the output stage is configured to generate the output voltage based on the second current and an adjustable offset current or an adjustable offset voltage.

9. The current sense circuit of claim 1,
wherein the biasing circuit includes a bias circuit resistor coupled to between the first circuit node and the output branch of the controllable current mirror.

10. The current sense circuit of claim 1,
wherein the controllable current mirror is configured to generate the first current and the corresponding second current with a positive and a negative sign.

11. A method comprising:
receiving a sense voltage between a first circuit node and a second circuit node coupled to a first terminal and a second terminal of a current sense resistor, respectively, wherein a first input and a second input of a differential amplifier are coupled to the first circuit node and the second circuit node via a first input resistor and a second input resistor, respectively;
setting a voltage at the first input of the differential amplifier to a predefined direct current (DC) voltage;
sinking or sourcing a first current in or from an input branch of a controllable current mirror based on one or more outputs of the differential amplifier and generating, by the controllable current mirror, a corresponding second current in its output branch; the input branch being coupled to the second input of the differential amplifier; and
generating a bias current and superposing the bias current with either the first current or the second current.

* * * * *